(12) United States Patent
Nagai

(10) Patent No.: US 8,089,156 B2
(45) Date of Patent: Jan. 3, 2012

(54) ELECTRODE STRUCTURE FOR SEMICONDUCTOR CHIP WITH CRACK SUPPRESSING DUMMY METAL PATTERNS

(75) Inventor: Noriyuki Nagai, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/239,119

(22) Filed: Sep. 26, 2008

(65) Prior Publication Data

US 2009/0108446 A1 Apr. 30, 2009

(30) Foreign Application Priority Data

Oct. 24, 2007 (JP) ................................. 2007-276727
Jun. 9, 2008 (JP) ................................. 2008-150538

(51) Int. Cl.
*H01L 23/485* (2006.01)
*H01L 29/40* (2006.01)

(52) U.S. Cl. ........ 257/758; 257/737; 257/738; 257/751; 257/E23.019

(58) Field of Classification Search .................. 257/737, 257/738, 751, 758, E23.01, E23.019–E23.021
See application file for complete search history.

(56) References Cited

U.S. PATENT DOCUMENTS

| | | | |
|---|---|---|---|
| 5,027,188 A | 6/1991 | Owada et al. | |
| 5,220,199 A | 6/1993 | Owada et al. | |
| 7,049,701 B2 | 5/2006 | Usui | |
| 2004/0145032 A1* | 7/2004 | Nakatani | 257/643 |
| 2005/0173801 A1 | 8/2005 | Mimura et al. | |
| 2006/0292711 A1* | 12/2006 | Su et al. | 438/14 |
| 2007/0080416 A1* | 4/2007 | Yoshioka et al. | 257/433 |

FOREIGN PATENT DOCUMENTS

| | | |
|---|---|---|
| JP | 1-114055 | 5/1989 |
| JP | 2006-19550 | 1/2006 |

* cited by examiner

*Primary Examiner* — Ha Tran T Nguyen
*Assistant Examiner* — Raj R Gupta
(74) *Attorney, Agent, or Firm* — McDermott Will & Emery LLP

(57) ABSTRACT

The bump electrode 100 of the present invention has a structure in which dummy metals 111 are provided in the uppermost layer portion of a silicon 101 between a pad-form wiring metal 102 and a wiring metal 103 such that an edge of each dummy metal and an edge of the barrier metal 107 are not aligned in a line, and a lot of interfaces are formed between the dummy metals 111 and an interlayer film 140, and therefore expansion of a crack generated due to bump stress concentrated on the under-edge portion 109 below the barrier metal 107 between the pad-form wiring metal 102 and the wiring metal 103 is suppressed.

33 Claims, 18 Drawing Sheets

ELECTRODE STRUCTURE FOR SEMICONDUCTOR CHIP WITH CRACK SUPPRESSING DUMMY METAL PATTERNS

BACKGROUND OF THE INVENTION

1. Field of the Invention

The present invention relates to an electrode structure for a semiconductor chip, and more particularly to an electrode structure for a semiconductor chip forming a flip-chip connection for suppressing expansion of a crack.

2. Description of the Background Art

A conventional structure of an electrode pad for a flip-chip connection in a semiconductor device will be described with reference to the drawings. FIG. 11A is a diagram illustrating a typical flip-chip connection structure. In FIG. 11A, a semiconductor chip 1101 and an interposer substrate 1102 are connected to each other through solder bumps. FIG. 11B is a cross-sectional view of the flip-chip connection structure shown in FIG. 11A along lines A-A' of FIG. 11A. In FIG. 11B, the semiconductor chip 1101 and the interposer substrate 1102 are connected to each other through the solder bumps 1103, and an underfill resin 1104 covers a connecting portion of the solder bumps 1103. Thus, a circuit formed inside the semiconductor chip 1101 is connected to the back surface of the interposer substrate 1102 through the solder bumps 1103, so that a mounting area is reduced, and a shortened wiring improves electric characteristics. Further, the connecting portion of the solder bumps 1103 is covered with the underfill resin 1104 so as to enhance the reliability of connections in the connecting portion of the solder bumps 1103.

The flip-chip connection pad formed inside the semiconductor chip 1101 may be, for example, an area pad, a peripheral pad, or the like. FIG. 12A is a diagram illustrating a layout pattern of an area pad in which electrode pads 1201 are provided over the entire surface of the semiconductor chip 1101. FIG. 12B is a diagram illustrating a layout pattern of a peripheral pad in which electrode pads 1202 are provided in the edge portions of the semiconductor chip 1101. In many cases, the flip-chip connection pad is formed such that the electrode pads form a uniform pattern on the surface of the semiconductor chip 1101.

FIG. 13 is a cross-sectional view illustrating a conventional bump electrode structure formed on the semiconductor chip 1101 shown in FIGS. 11A, 11B, 12A and 12B. In FIG. 13, a conventional bump electrode 1300 has a structure in which a pad-form wiring metal 1302 is positioned in the uppermost layer portion of a silicon 1301, and a wiring metal 1303 is positioned in the same layer as that of the pad-form wiring metal 1302. A pad connecting metal 1304 is positioned on the pad-form wiring metal 1302. The upper surfaces of the silicon 1301 and the pad connecting metal 1304 are covered by a nitride protective film 1305 mainly formed by a nitride film, and a resin material protective film 1306 made of resin material such as a polyimide so as to protect the pad connecting metal 1304. However, a part of the upper surface of the pad connecting metal 1304 forms an opening 1308 which is not covered by the nitride protective film 1305 and the resin material protective film 1306. The pad connecting metal 1304 contacts the barrier metal 1307 at the opening 1308 and therefore the pad connecting metal 1304 electrically connects to the solder bump 1103 formed on the barrier metal 1307.

In the conventional bump electrode 1300, a portion, of the upper surface of the pad connecting metal 1304, which is not covered by the nitride protective film 1305 and the resin material protective film 1306, that is, the opening 1308 at which the pad connecting metal 1304 contacts the barrier metal 1307, is defined in accordance with a range of the resin material protective film 1306. Further, the resin material protective film 1306 is provided in an under-edge potion 1309 below the barrier metal 1307, so that bump stress concentrated on the under-edge portion 1309 below the barrier metal 1307 can be alleviated. The bump stress applied to the under-edge portion 1309 below the barrier metal 1307 is, for example, a stress which is applied to a barrier metal when the solder bump is formed, and a stress which is applied to the solder bump when the semiconductor chip is mounted on the interposer substrate.

However, the structure of the conventional bump electrode 1300 shown in FIG. 13 causes a problem that malfunction that an electrical short often occurs between the solder bumps of the bump electrodes adjacent to each other when plating, which is a typical technique for forming a solder bump, is performed. FIG. 14 is a diagram illustrating a state where the electrical short occurs between the solder bumps 1103 of the bump electrodes 1300, shown in FIG. 13, adjacent to each other. In FIG. 14, a conductive component α is attached to the resin material protective film 1306, and an electrical short occurs between the solder bumps 1103 adjacent to each other through the barrier metals 1307. This is because the conductive component a is often attached to the resin material protective film 1306 while plating is being performed for forming the solder bump 1103.

Another conventional bump electrode for solving the malfunction of the conventional bump electrode 1300 as described above will be described. FIG. 15 is a cross-sectional view of a conventional bump electrode 1500 for solving the malfunction generated in the conventional bump electrode 1300. In FIG. 15, in the conventional bump electrode 1500, a resin material protective film 1506 is provided on a nitride protective film 1305 such that the resin material protective film 1506 does not contact a barrier metal 1507. Therefore, a portion, of the upper surface of the pad connecting metal 1304, which is not covered by the nitride protective film 1305, that is, an opening 1508 at which the pad connecting metal 1304 contacts the barrier metal 1507 is defined in accordance with a range of the nitride protective film 1305.

In the conventional bump electrode 1500 having the structure described above, when plating, which is a typical technique for forming a solder bump, is performed, the electrical short may not easily occur between the solder bumps of the bump electrodes adjacent to each other. FIG. 16 is a diagram illustrating a state where the conductive component a is attached to the resin material protective films 1506 of the bump electrodes 1500, shown in FIG. 15, adjacent to each other. In FIG. 16, even when the conductive component a is attached to the resin material protective film 1506, the electrical short does not occur between the solder bumps 1103 of the bump electrodes 1500 adjacent to each other because the resin material protective film 1506 does not contact the barrier metal 1507.

The structure of the conventional bump electrode described above is disclosed in, for example, Japanese Laid-Open Patent Publication No. 1-114055 and Japanese Laid-Open Patent Publication No. 2006-19550.

However, the conventional bump electrode 1500 shown in FIG. 15 has a problem described below. FIG. 17 is a diagram illustrating the uppermost layer portion of the silicon 1301 including the pad-form wiring metal 1302 and the wiring metal 1303 in the conventional bump electrode 1500 shown in FIG. 15. The edge (indicated by a dashed line 1507a in FIG. 17) of the barrier metal 1507 is above an area 1700 between the pad-form wiring metal 1302 and the wiring metal 1303. In the conventional bump electrode 1500 shown in FIG. 15, the resin material protective film 1506 is not contained in the under-edge portion 1509 below the barrier metal 1507, and therefore a bump stress concentrated on the under-edge portion 1509 below the barrier metal 1507 is not alleviated, although the bump electrode 1300 shown in FIG. 13 is allowed to alleviate the bump stress.

Therefore, there is a problem that a crack is generated in the nitride protective film 1305 due to the bump stress concentrated on the under-edge portion 1509 below the barrier metal 1507. FIG. 18 is an enlarged view of a portion B1 of the bump electrode 1500 shown in FIG. 15. In FIG. 18, a crack 1800 is generated in the nitride protective film 1305 due to bump stress concentrated on the under-edge portion 1509 below the barrier metal 1507.

SUMMARY OF THE INVENTION

Therefore, an object of the present invention is to provide an electrode structure for a semiconductor chip for preventing electrical short from occurring between solder bumps of bump electrodes adjacent to each other, and suppressing expansion of a crack generated due to bump stress concentrated on an under-edge portion below a barrier metal, so as to enhance the reliability of the bump connection of the electrode pad.

In order to attain the object mentioned above, a first electrode structure for a semiconductor chip according to the present invention is an electrode structure for a semiconductor chip comprising: a semiconductor substrate having, in an uppermost layer portion thereof, a pad-form wiring metal and a wiring metal, the pad-form wiring metal and the wiring metal having potentials, respectively, different from each other; a pad connecting metal formed on the semiconductor substrate; a resin protective film, having an opening provided so as to expose the pad connecting metal, for covering the semiconductor substrate; a barrier metal formed, on the pad connecting metal, in the opening of the resin protective film, and a bump formed on the barrier metal, and the electrode structure for the semiconductor chip comprises a dummy pattern, provided between the pad-form wiring metal and the wiring metal, having no potential, and the dummy pattern is formed in a range including a portion vertically below an edge of the barrier metal.

Preferably, a range above the range in which the dummy pattern is formed includes a range in which the resin protective film is not provided.

Further, in order to attain the object mentioned above, a second electrode structure for a semiconductor chip according to the present invention is an electrode structure for a semiconductor chip comprising: a semiconductor substrate having a pad-form wiring metal and a wiring metal both of which are provided in an uppermost layer portion thereof; a barrier metal formed on the pad-form wiring metal; and a bump formed on the barrier metal, and the electrode structure for the semiconductor chip comprises a metal pattern provided between the pad-form wiring metal and the wiring metal, and the metal pattern is formed in a range including a portion vertically below an edge of the barrier metal.

Preferably, the electrode structure for the semiconductor chip further comprises a resin protective film for covering a range, on the semiconductor substrate, in which the barrier metal is not formed, and a range above the range in which the metal pattern is formed includes a range in which the resin protective film is not provided.

Further, preferably, the metal pattern includes a metal, and an edge of the metal and the edge of the barrier metal are not aligned in a line extending vertically downward from the edge of the barrier metal. Alternatively, the metal pattern includes a plurality of metals, and a specific metal, among the plurality of metals, is positioned vertically below the edge of the barrier metal, and an edge of the specific metal and the edge of the barrier metal are not aligned in a line extending vertically downward from the edge of the barrier metal.

Further, preferably, the metal pattern includes the plurality of metals which are equally spaced from each other, and interlayer films each formed between any adjacent metals among the plurality of metals.

Further, preferably, the plurality of metals forming the metal pattern form a continuous surface.

Furthermore, preferably, the plurality of metals forming the continuous surface each has a regular hexagonal shape.

Further, preferably, the plurality of metals forming the metal pattern are positioned radially from a center of the semiconductor chip.

Further, preferably, the metal pattern includes a pattern for suppressing a generation of a crack.

Further, preferably, the metal pattern includes a pattern for preventing expansion of a generated crack.

Further, preferably, the pattern for preventing expansion of a generated crack is formed by a plurality of metals which are discontinuous.

Further, preferably, the metal pattern is a dummy pattern having no potential or the metal pattern has a same potential as the pad-form wiring metal.

Further, in order to attain the objected mentioned above, the semiconductor chip according to the present invention is a semiconductor chip having a plurality of electrodes on an upper surface thereof, and the electrode structure described above is formed only at and around four corners of the semiconductor chip, the four corners of the semiconductor chip being farthest from a center of the semiconductor chip.

As described above, the electrode structure for the semiconductor chip according to the present invention enables prevention of electrical short between the solder bumps of the bump electrodes adjacent to each other, suppression of expansion of a crack generated due to bump stress concentrated on the under-edge position below the barrier metal, and enhancement of the reliability of the bump connection of the electrode pad. Further, in the electrode structure for the semiconductor chip according to the present invention, generation of a crack due to bump stress concentrated on the under-edge position of the barrier metal may not be easily caused, thereby also exerting an effect of suppressing generation of a crack.

The semiconductor device to which the electrode structure for the semiconductor chip according to the present invention is applied enables suppression of expansion of a crack generated due to bump stress, and enhancement of the reliability of connection of the solder bump, so that the diameter of the bump can be reduced for the flip-chip connection so as to reduce a pad pitch, and therefore the present invention is applicable for increasing a density of the semiconductor device, or the like.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings.

First Embodiment

Figure 1:
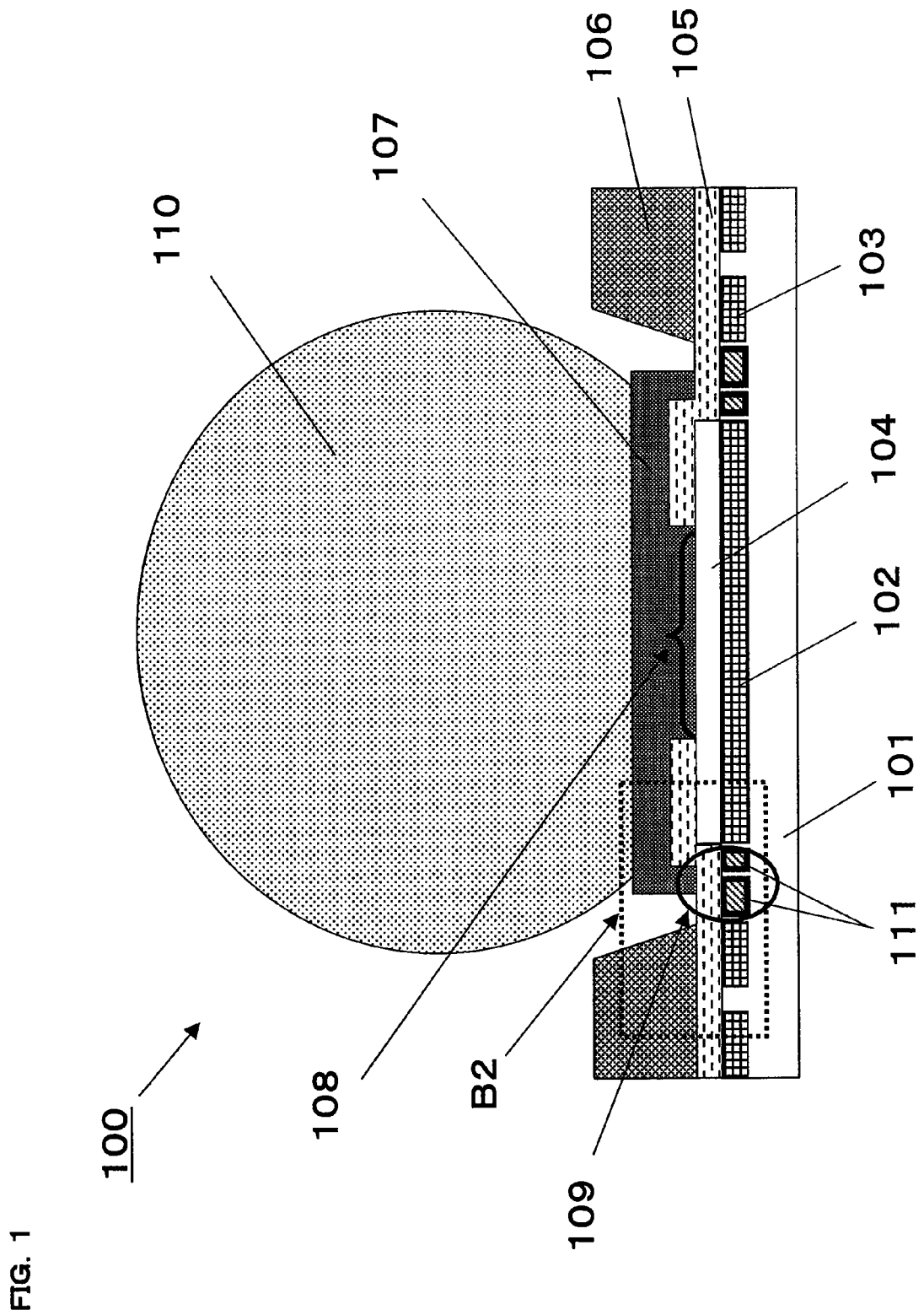
FIG. 1 is a diagram illustrating a bump electrode for a semiconductor device according to a first embodiment of the present invention.
Figure 15:
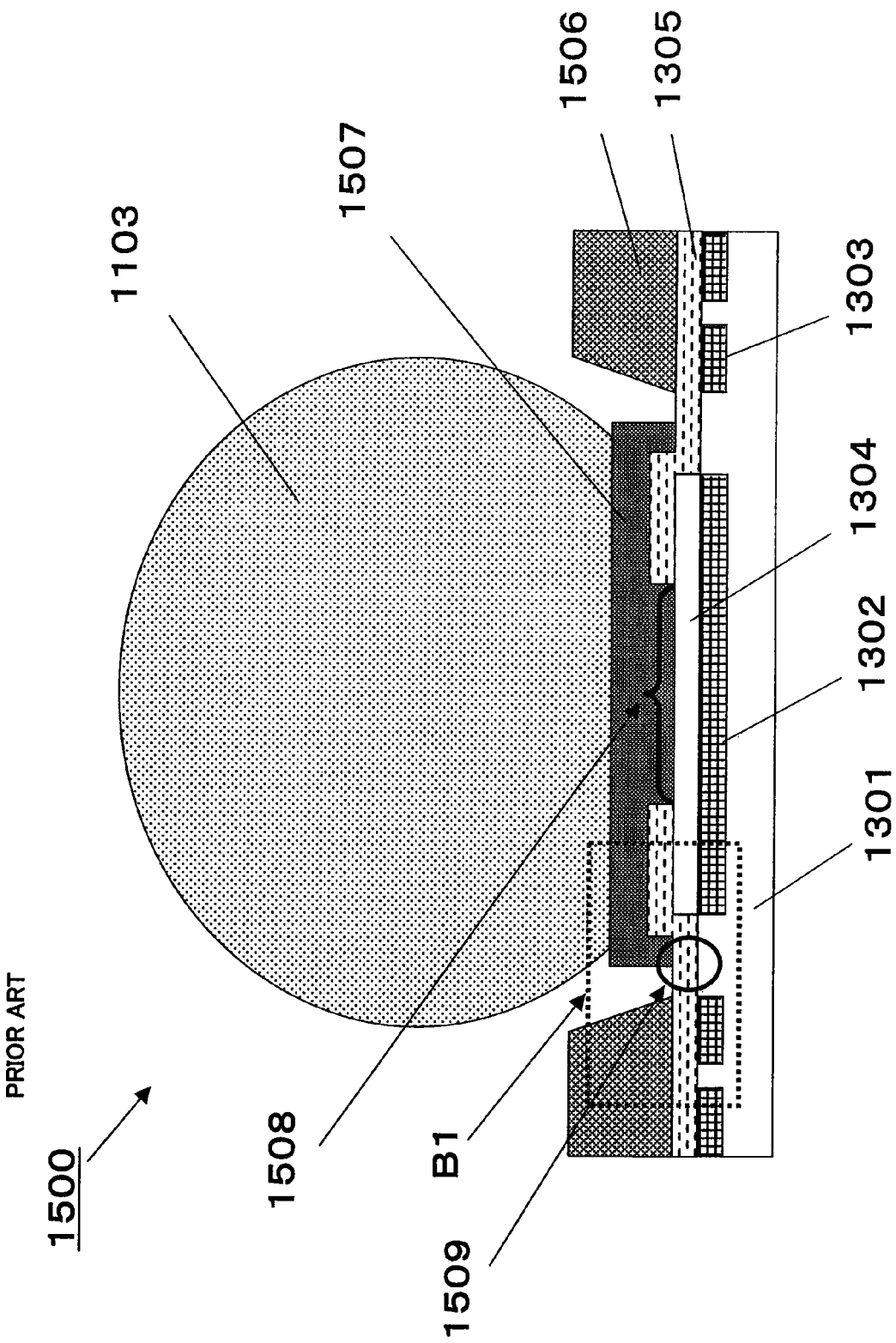
FIG. 15 is a diagram illustrating a bump electrode of another conventional semiconductor device.
Figure 16:
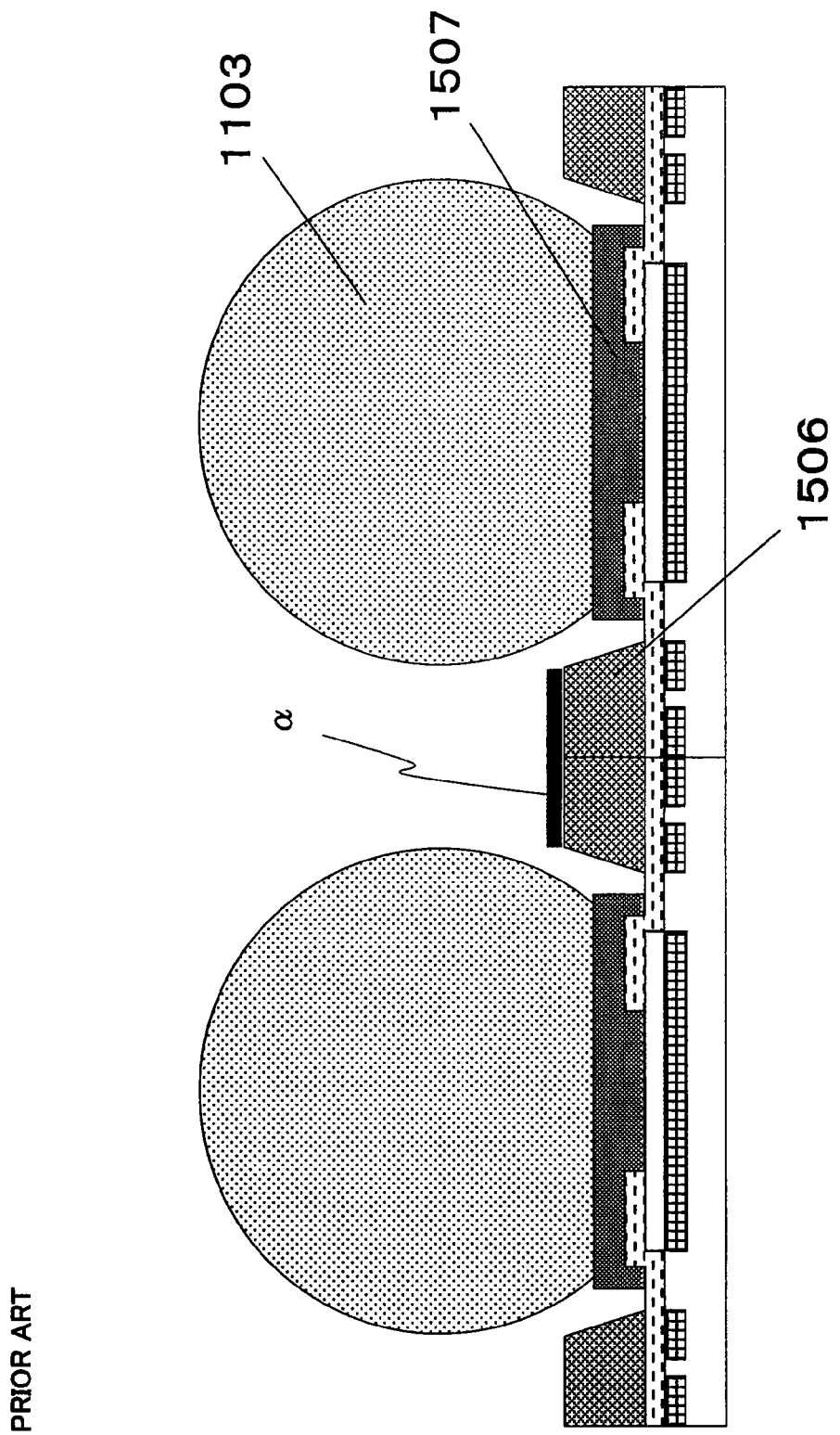
FIG. 16 is a diagram illustrating the bump electrodes, adjacent to each other, of the another conventional semiconductor device.
Figure 17:
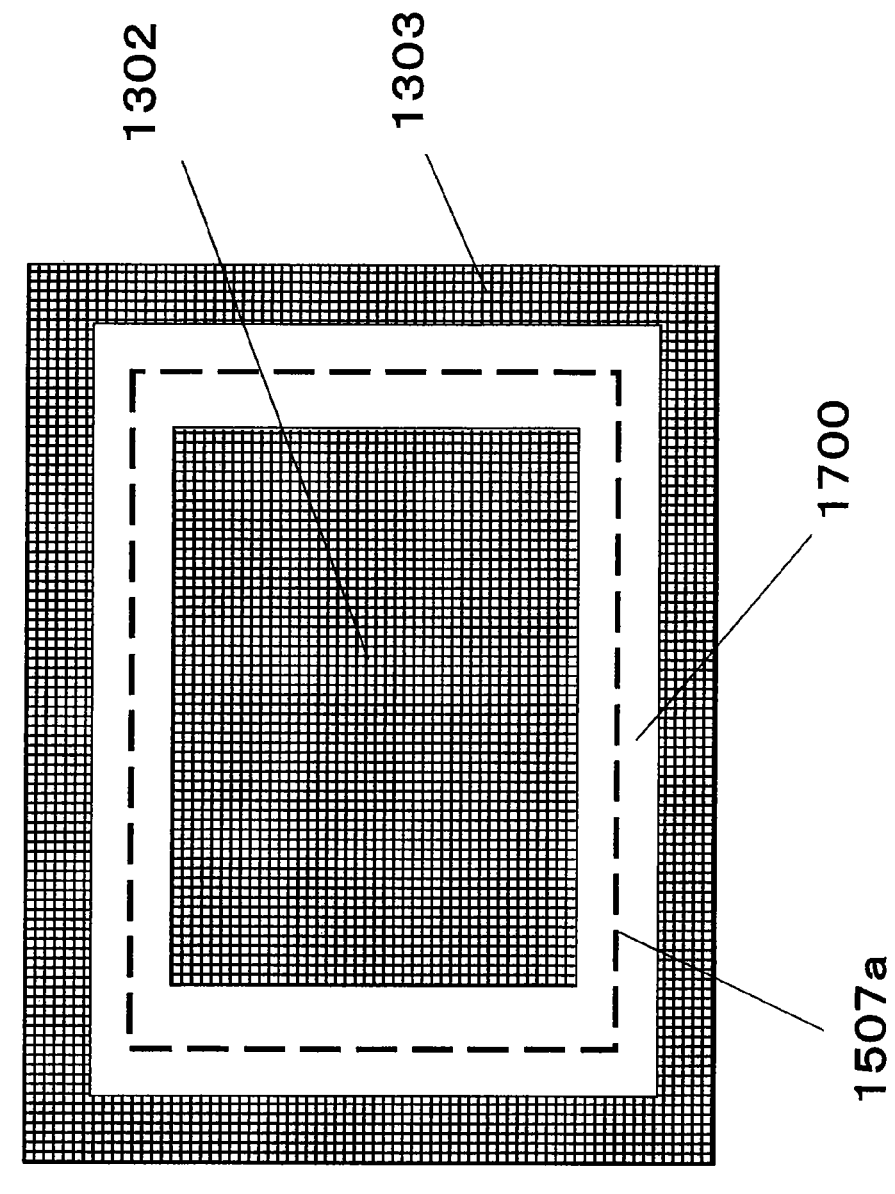
FIG. 17 is a diagram illustrating an uppermost layer portion of an electrode structure for a conventional semiconductor chip.
Figure 18:
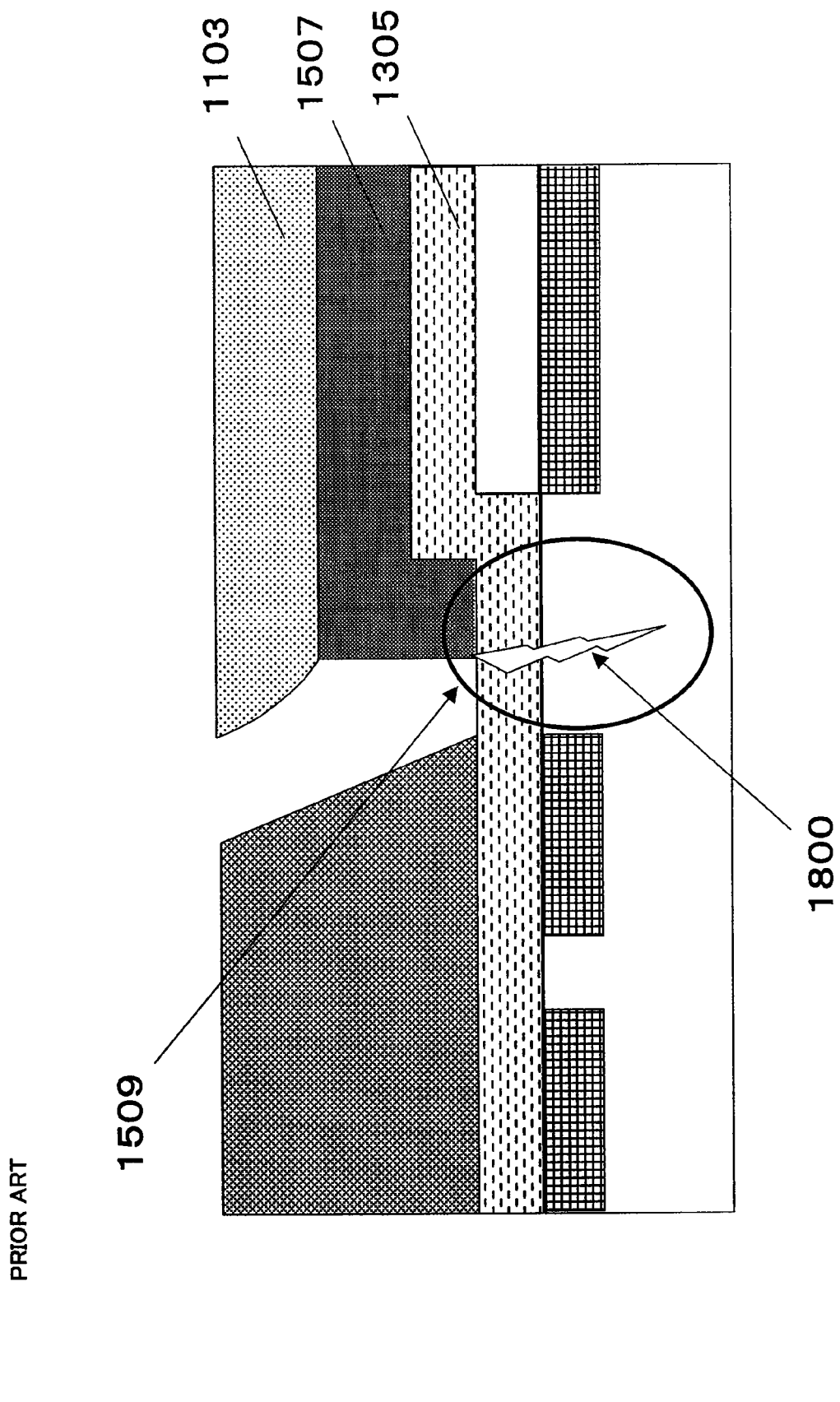
FIG. 18 is an enlarged view of a portion B1 of FIG. 15.

FIG. 1 is a diagram illustrating a bump electrode 100 for a semiconductor device according to a first embodiment of the present invention. In FIG. 1, the bump electrode 100 has a structure in which a pad-form wiring metal 102 and a wiring metal 103 are positioned in the uppermost layer portion of a silicon 101. A pad connecting metal 104 is positioned on the pad-form wiring metal 102. The upper surfaces of the silicon 101 and the pad connecting metal 104 are covered by a nitride protective film 105 mainly formed by a nitride film so as to protect the pad connecting metal 104. However, a part of the upper surface of the pad connecting metal 104 forms an opening 108 which is not covered by the nitride protective film 105. The pad connecting metal 104 contacts a barrier metal 107 at the opening 108, and therefore the pad connecting metal 104 electrically connects to a solder bump 110 formed on the barrier metal 107. A resin material protective film 106 is provided on the nitride protective film 105 such that the resin material protective film 106 does not contact the barrier metal 107. A portion, on the pad connecting metal 104, which is not covered by the nitride protective film 105, that is, the opening 108 at which the pad connecting metal 104 contacts the barrier metal 107, is defined in accordance with a range of the nitride protective film 105. The structure of the bump electrode 100 as described above is the same as the structure of the conventional bump electrode 1500 shown in FIG. 15.

Although in the present embodiment the nitride protective film 105 is used as a silicon surface protective layer, the protective film is not necessarily made of nitride, and the protective film may be, for example, an oxide film. Further, the barrier metal 107 is a material, such as titanium, tungsten, nickel, having a relatively large Young's modulus.

Figure 2:
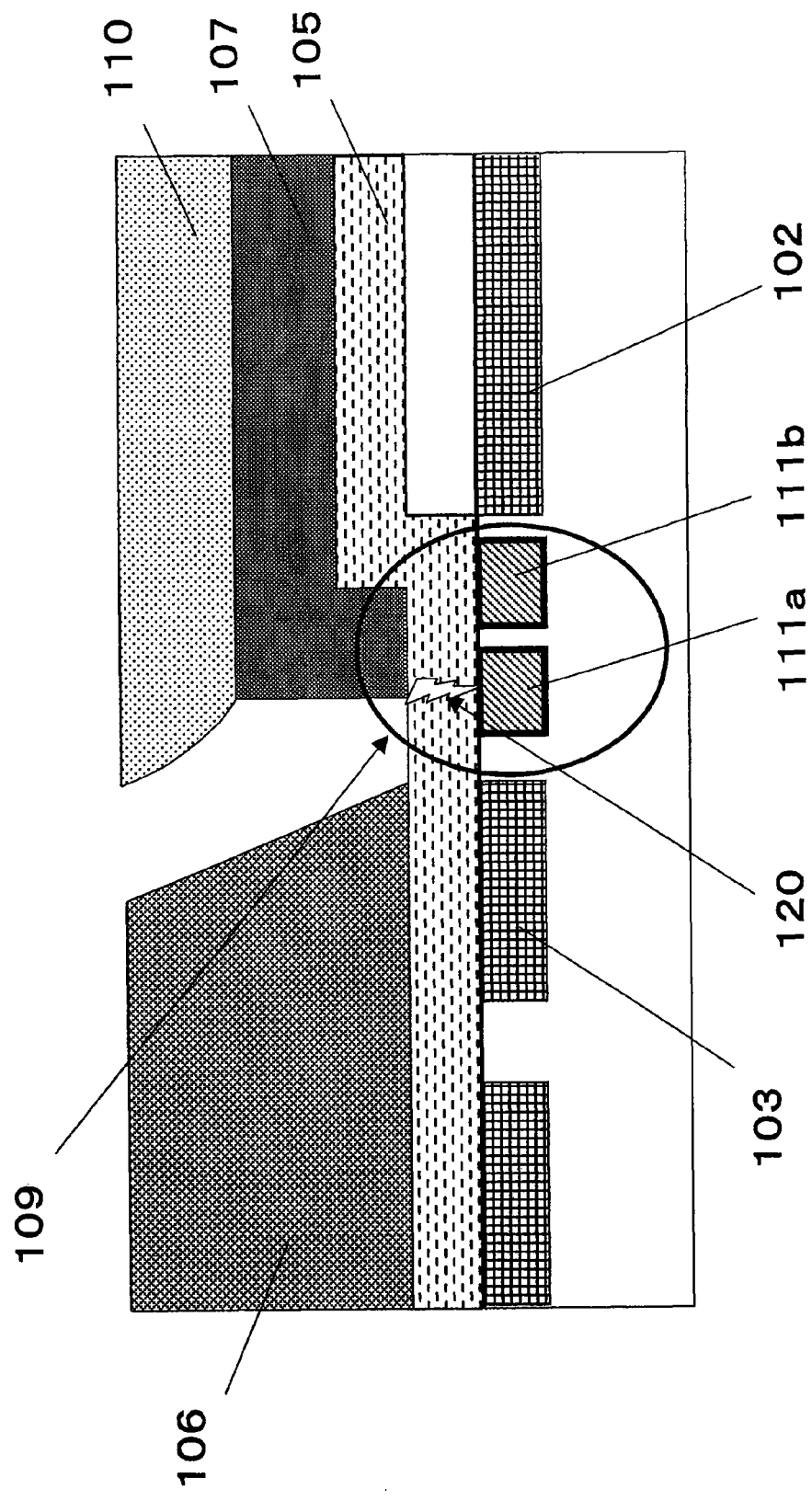
FIG. 2 is an enlarged view of a portion B2 of FIG. 1 illustrating a crack generated in the vertical direction.

Next, a difference between the bump electrode 100 according to the first embodiment of the present invention and the conventional bump electrode 1500 will be described. The bump electrode 100 is different from the conventional bump electrode 1500 in that the bump electrode 100 has dummy metals 111. Further, the dummy metals 111 are positioned in the uppermost layer portion of the silicon 101 between the pad-form wiring metal 102 and the wiring metal 103. FIG. 2 is an enlarged view of a portion B2 of the bump electrode 100 shown in FIG. 1. Each dummy metal 111 includes a first dummy metal 111a and a second dummy metal 111b.

Positionings of the first dummy metal 111a and the second dummy metal 111b will be described in detail. The first dummy metal 111a is positioned such that the edge of the first dummy metal 111a and the edge of the barrier metal 107 are not aligned in a line. When the edge of the barrier metal 107 and the edge of the first dummy metal 111a are aligned in a line, bump stress concentrated on the under-edge portion 109 below the barrier metal 107 may cause generation of a crack. When the first dummy metal 111a is positioned in a range including a portion vertically below the edge of the barrier metal 107, it is possible to suppress expansion of a crack 120 generated in a vertically downward direction from the edge of the barrier metal 107. Here, the bump stress is most highly concentrated on the portion vertically below the edge of the barrier metal 107.

Figure 3:
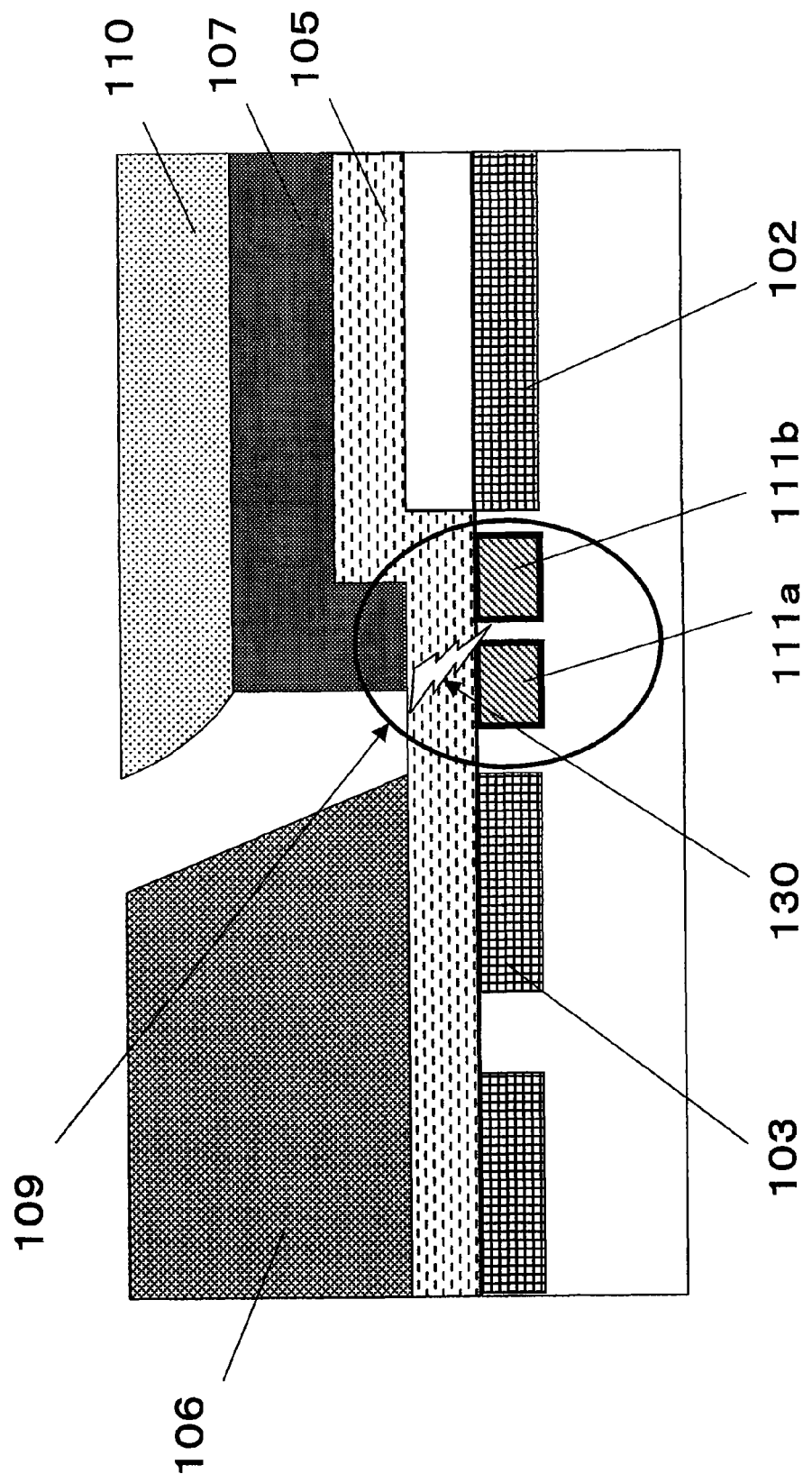
FIG. 3 is an enlarged view of the portion B2 of FIG. 1 illustrating a crack generated in the diagonal direction.

The second dummy metal 111b is positioned in a range other than the range, as described above, in which the first dummy metal 111a is positioned such that the second dummy metal 111b is spaced from the first dummy metal 111a over a certain distance. When the first dummy metal 111a is positioned as described above, a crack may be generated in the under-edge portion 109 below the barrier metal 107 so as to expand in the diagonal direction from the edge position of the barrier metal 107 toward the edge position of the first dummy metal 111a. FIG. 3 is an enlarged view of the portion B2 of the bump electrode 100 in which a crack 130 is generated in the nitride protective film 105 so as to expand in the diagonal direction. The second dummy metal 111b is not positioned in the portion vertically below the edge of the barrier metal 107, but is spaced from the first dummy metal 111a over a certain distance, so as to suppress expansion of the crack 130 generated in the nitride protective film 105 in the diagonal direction. By positioning the second dummy metal 111b as described above, it is possible to suppress expansion of a crack generated in a wide range in the nitride protective film 105.

Figure 4:
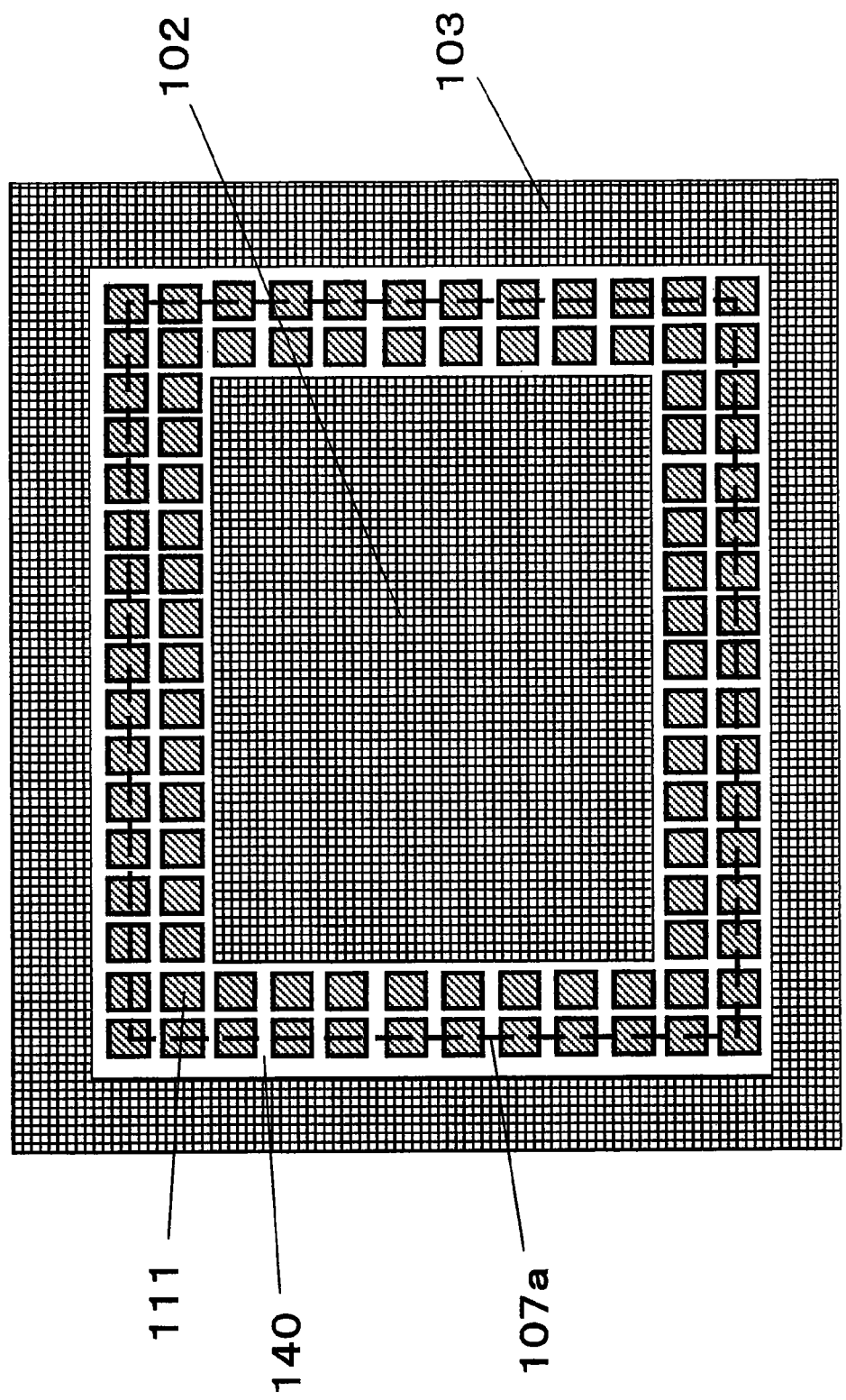
FIG. 4 is a diagram illustrating a dummy pattern of an electrode pad according to the first embodiment of the present invention.

Next, a dummy pattern formed by the dummy metals 111 will be described in detail. FIG. 4 is a diagram illustrating the uppermost layer portion of the silicon 101 in which the pad-form wiring metal 102 and the wiring metal 103 are positioned in the bump electrode 100 according to the first embodiment. In FIG. 4, a dot pattern is formed by positioning a plurality of the dummy metals 111 between the pad-form wiring metal 102 and the wiring metal 103 so as to equally space the plurality of the dummy metals 111 from each other. An interlayer film 140 made of tetraethoxysilane or the like is provided among the plurality of the dummy metals 111. The edge of the barrier metal 107 is positioned, as indicated by a dashed line 107a in FIG. 4, above a range in which the dot pattern is formed.

By forming multiple interfaces between the plurality of the dummy metals 111 and the interlayer film 140, a crack generated due to bump stress concentrated on the under-edge portion 109 below the barrier metal 107 reaches the interfaces, thereby suppressing expansion of the crack.

As described above, in the electrode structure for the semiconductor chip according to the first embodiment of the present invention, when a crack is generated due to bump stress concentrated on the under-edge portion below the barrier metal, not only the expansion of a crack generated in the vertically downward direction from the edge of the barrier metal can be suppressed, but also expansion of the crack generated in a wide range can be suppressed, so as to enhance the reliability of bump connection of the electrode pad.

Although, in the present embodiment, a dot pattern in which the dummy metals 111 each including two types of dummy metals are positioned between the pad-form wiring metal 102 and the wiring metal 103 as shown in FIG. 4 is used as the dummy pattern, the present invention is not limited thereto. For example, three or more types of dummy metals smaller than each dummy metal 111 may be positioned between the pad-form wiring metal 102 and the wiring metal 103 so as to form a dot pattern finer than that shown in FIG. 4.

Second Embodiment

Figure 5:
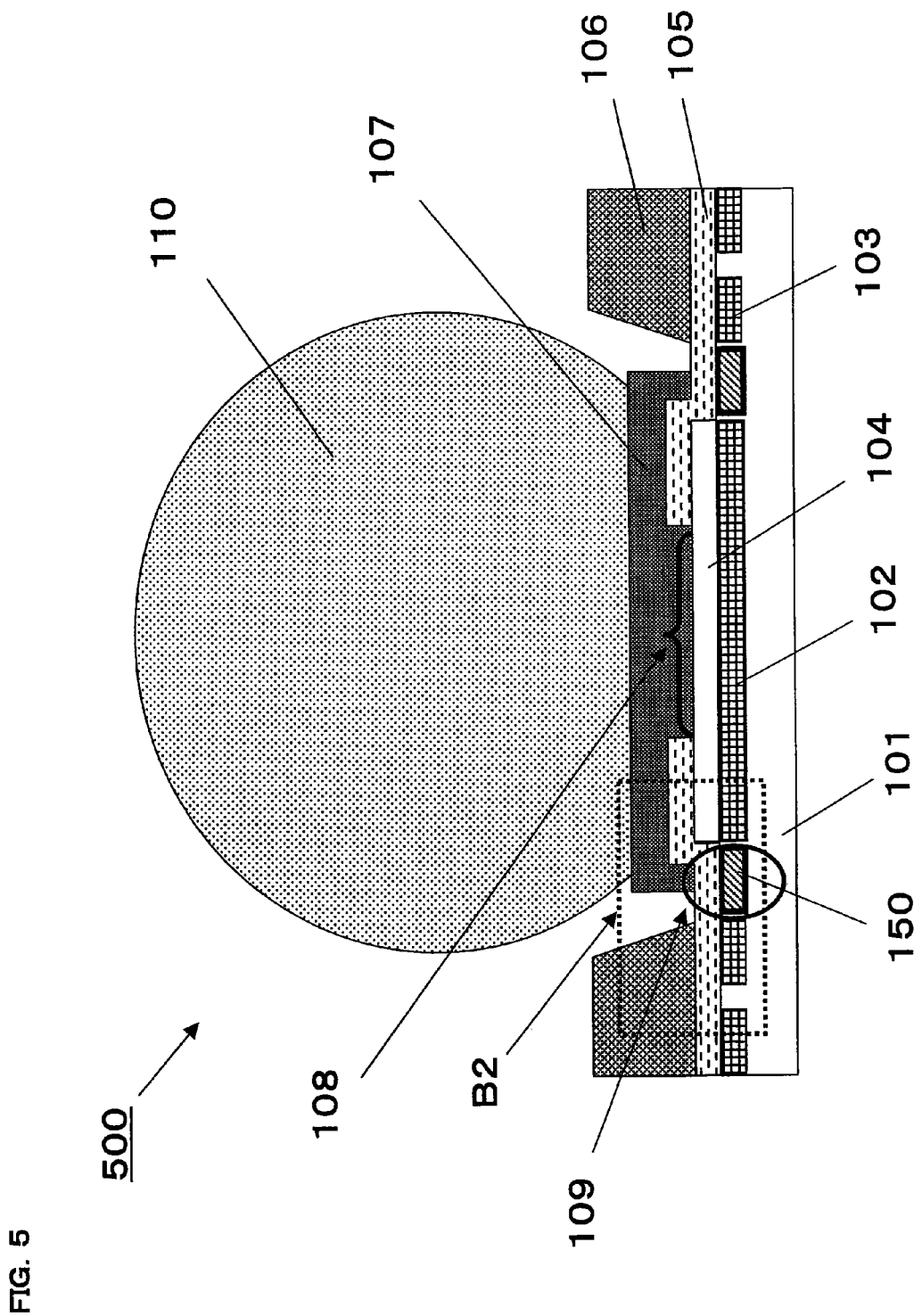
FIG. 5 is a diagram illustrating a bump electrode for a semiconductor device according to a second embodiment of the present invention.

An electrode structure for a semiconductor chip according to a second embodiment of the present invention is the same as the electrode structure for the semiconductor chip according to the first embodiment described above except for a dummy pattern formed by the dummy metal. FIG. 5 is a diagram illustrating a bump electrode 500 of a semiconductor device according to the second embodiment of the present invention. In FIG. 5, the same components as shown in FIG. 1 are denoted by the same corresponding reference characters, and the description thereof is not given. In the bump electrode 500, a dummy metal 150 is provided in the uppermost layer portion of the silicon 101 between the pad-form wiring metal 102 and the wiring metal 103.

Figure 6:
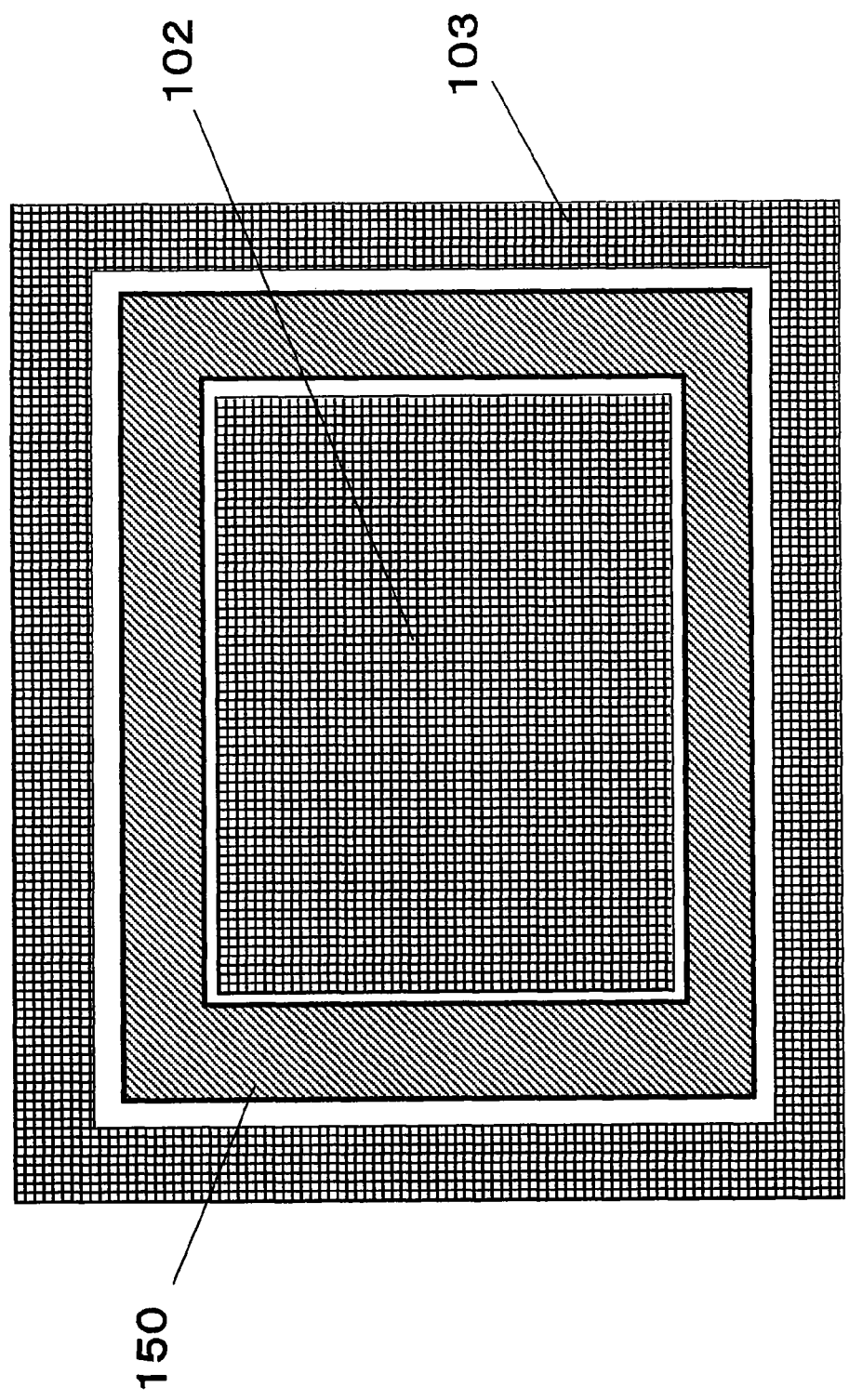
FIG. 6 is a diagram illustrating a dummy pattern of an electrode pad according to the second embodiment of the present invention.

A dummy pattern of the electrode pad according to the second embodiment will be described below in detail. FIG. 6 is a diagram illustrating a dummy pattern of the electrode pad according to the second embodiment. In FIG. 6, the dummy metal 150 having a continuous surface is provided in a wide range between the pad-form wiring metal 102 and the wiring metal 103, thereby forming a line pattern.

By forming, in the wide range, the dummy metal 150 having the continuous surface as described above, it is possible to suppress expansion of a crack generated due to bump stress concentrated on the under-edge portion 109 below the barrier metal 107 between the pad-form wiring metal 102 and the wiring metal 103. In general, when no interface is provided among metals, the bump stress may not be easily concentrated. Therefore, the structure of the line pattern according to the second embodiment may more efficiently prevent generation of a crack due to bump stress concentrated on the under-edge portion 109 below the barrier metal 107 from being caused, as compared to the structure of the dot pattern according to the first embodiment described above, so that an effect of suppressing generation of a crack may be enhanced.

As described above, in the electrode structure for the semiconductor chip according to the second embodiment of the present invention, expansion of a crack generated in a wide range due to bump stress concentrated on the under-edge portion below the barrier metal may be suppressed, and the reliability of the bump connection of the electrode pad may be enhanced. Further, the generation of a crack due to bump stress concentrated on the under-edge portion below the barrier metal may not be easily caused, and therefore generation of a crack may be suppressed.

Third Embodiment

Figure 7:
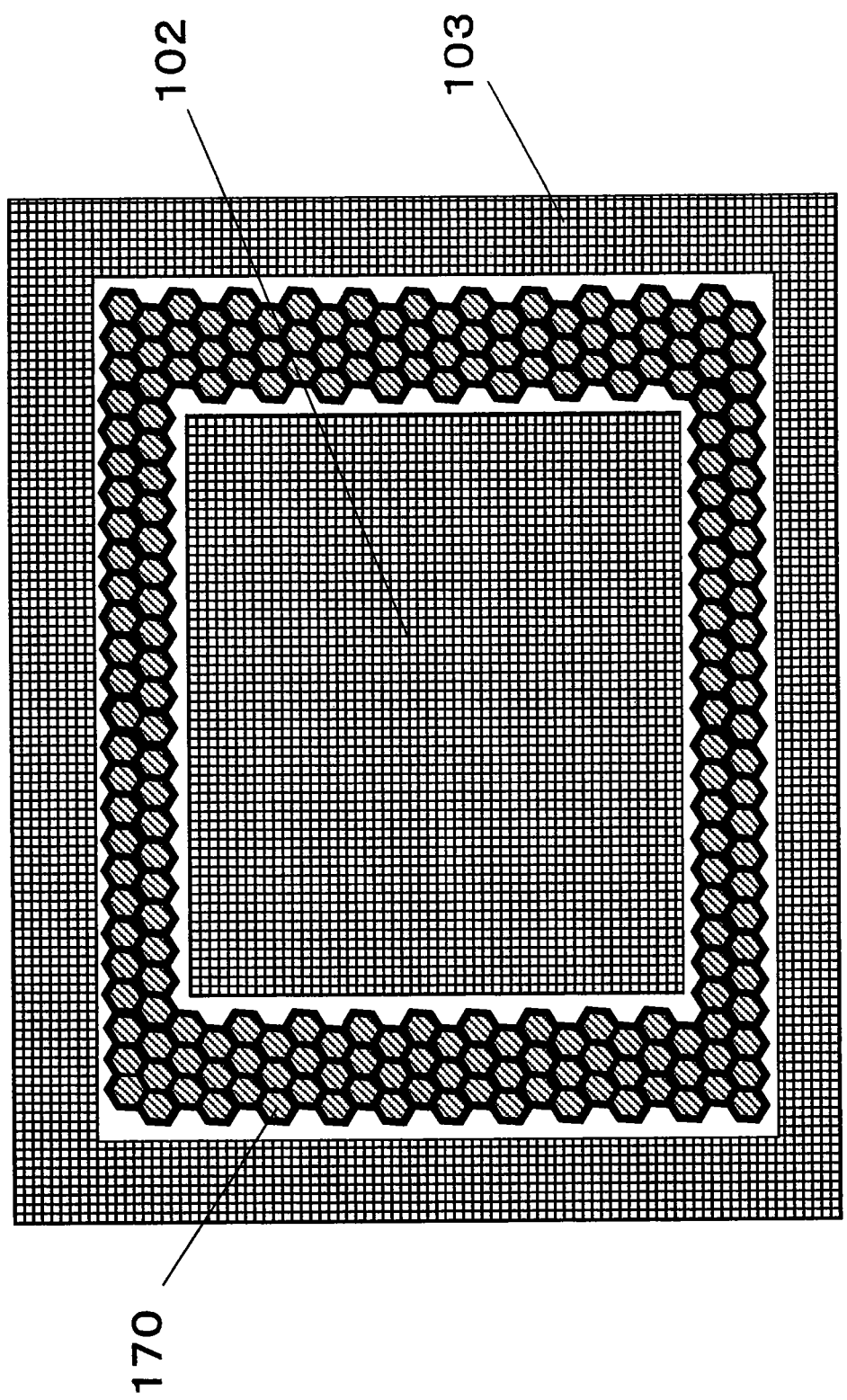
FIG. 7 is a diagram illustrating a dummy pattern of an electrode pad according to a third embodiment of the present invention.

An electrode structure for a semiconductor chip according to a third embodiment of the present invention is the same as the electrode structure for the semiconductor chip according to the second embodiment described above except for a dummy pattern formed by the dummy metal. Hereinafter, a dummy pattern of an electrode pad according to the third embodiment will be described. FIG. 7 is a diagram illustrating a dummy pattern of an electrode pad according to the third embodiment. The dummy pattern according to the second embodiment as shown in FIG. 6 is formed such that the dummy metal 150 forms a continuous surface, whereas the dummy pattern shown in FIG. 7 is a honeycomb pattern in which a plurality of dummy metals 170 each having a regular hexagonal shape are continuously positioned.

As describe above, when the plurality of dummy metals 170 each having a regular hexagonal shape form a continuous surface, expansion of a crack generated due to bump stress concentrated on the under-edge portion 109 below the barrier metal 107 between the pad-form wiring metal 102 and the wiring metal 103 may be suppressed. The honeycomb pattern according to the third embodiment forms a continuous surface as described in the second embodiment, and therefore generation of a crack due to bump stress concentrated on the under-edge portion 109 below the barrier metal 107 may not be easily caused.

As described above, in the electrode structure for the semiconductor chip according to the third embodiment of the present invention, expansion of a crack generated in a wide range due to bump stress concentrated on the under-edge portion below the barrier metal may be suppressed, and the reliability of bump connection of the electrode pad may be enhanced.

Although the dummy pattern of the electrode pad according to the third embodiment is a honeycomb pattern formed by the plurality of the dummy metals 170 each having a regular hexagonal shape, the present invention is not limited thereto. For example, any pattern in which a plurality of dummy metals each shaped as a polygon representing a uniformness form a continuous surface may allow the same effect to be exerted.

Fourth Embodiment

Figure 8:
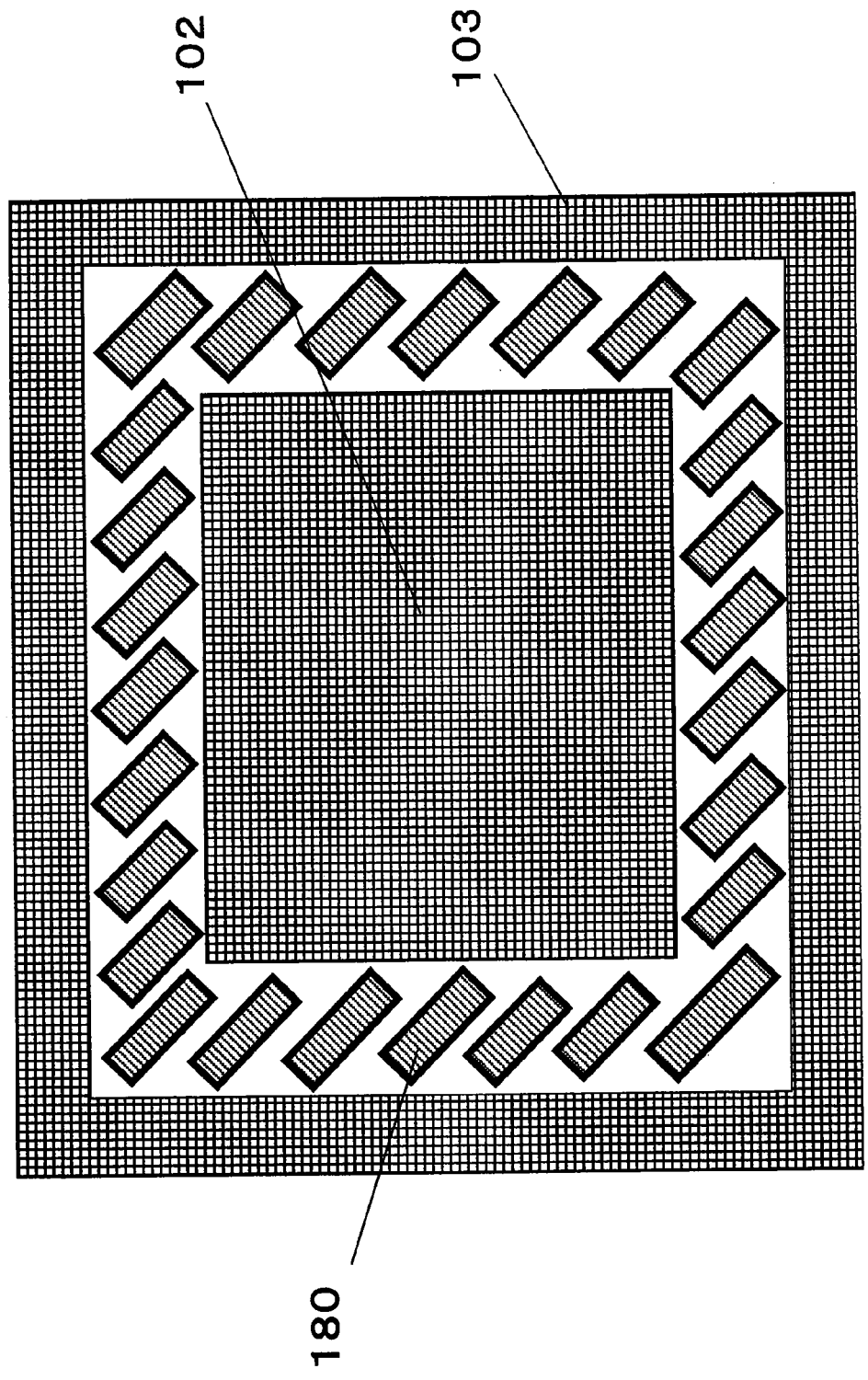
FIG. 8 is a diagram illustrating a dummy pattern of an electrode pad according to a fourth embodiment of the present invention.

A dummy pattern, formed by dummy metals, of an electrode structure for a semiconductor chip according to a fourth embodiment of the present invention is different from the dummy pattern of the electrode structure for the semiconductor chip according to any of the first to the third embodiments described above. Hereinafter, a dummy pattern of an electrode pad according to the fourth embodiment will be described. In FIG. 8, the same components as shown in FIG. 4 to FIG. 7 are denoted by the same corresponding reference characters, and the description thereof is not given. FIG. 8 is a diagram illustrating a dummy pattern of an electrode pad according to the fourth embodiment. In FIG. 8, a diagonal line pattern is formed such that a plurality of dummy metals 180 are diagonally positioned between the pad-form wiring metal 102 and the wiring metal 103.

Next, a direction in which the plurality of dummy metals 180 forming the diagonal line pattern are positioned will be described in detail. For example, when the solder bump is formed, or when the semiconductor chip is mounted on the interposer substrate, a direction in which the bump stress is applied to each electrode pad depends on a position at which the electrode pad is positioned in the semiconductor chip. In general, the direction in which the bump stress is applied to the electrode pads varies radially from the center of the semiconductor chip. Therefore, the direction in which the plurality of dummy metals 180 forming the diagonal line pattern are positioned depends on a position at which the electrode pad including the plurality of dummy metals 180 is positioned in the semiconductor chip.

Figure 9:
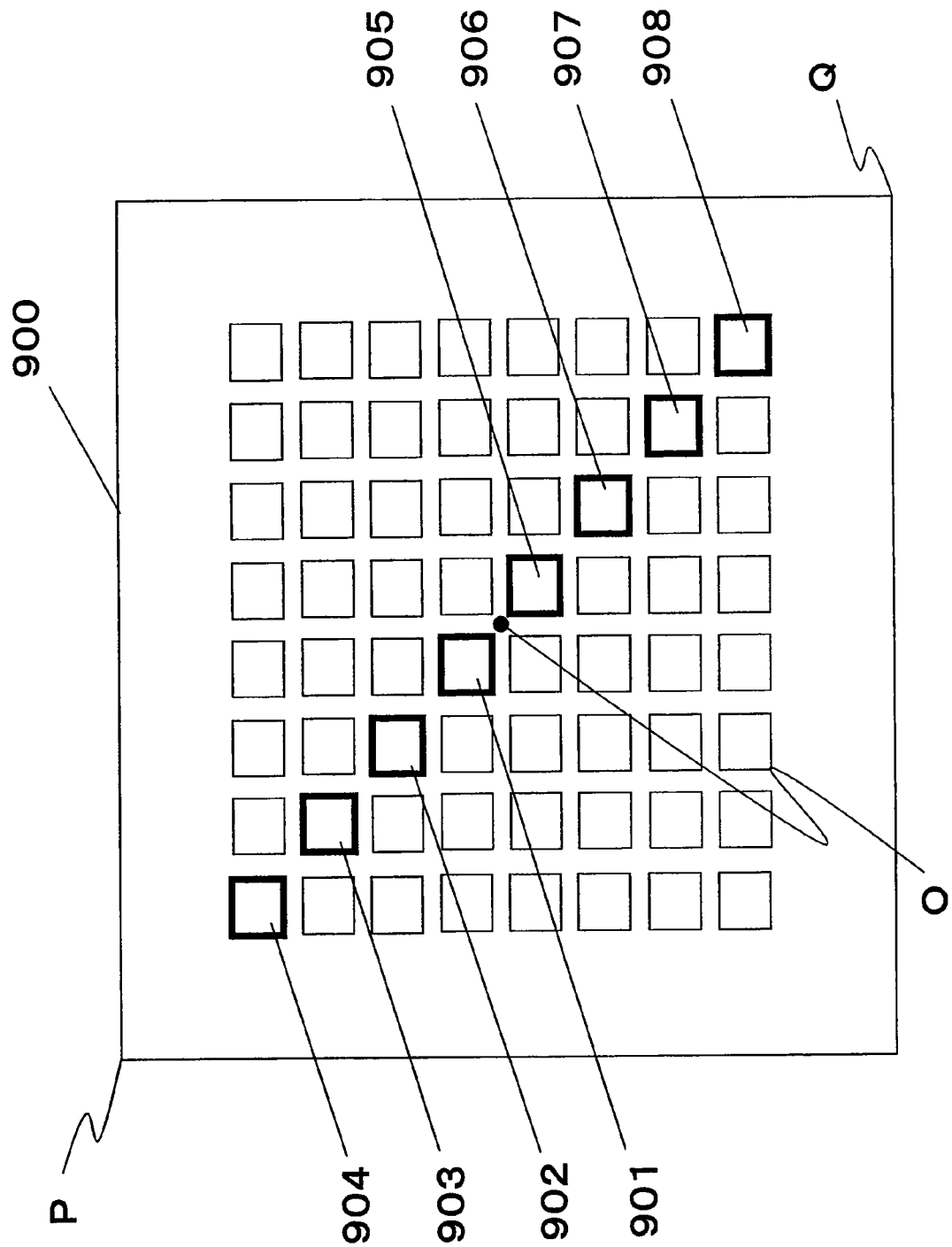
FIG. 9 is a diagram illustrating a semiconductor chip according to the fourth embodiment of the present invention.

FIG. 9 is a diagram illustrating a semiconductor chip 900 on which the electrode pads are positioned over the entire surface of the semiconductor chip. The electrode pad having the diagonal line pattern shown in FIG. 8 is used as the electrode pads 901 to 904 aligned from the center O of the semiconductor chip 900 toward a point P representing the upper left corner of the semiconductor chip 900, and the electrode pads 905 to 908 aligned from the center O of the semiconductor chip 900 toward a point Q representing the lower right corner of the semiconductor chip 900. In this case, the plurality of dummy metals 180, of the electrode pad, forming the diagonal line pattern are positioned along a direction from the center of the semiconductor chip toward the electrode pad including the plurality of dummy metals 180. It is necessary to similarly position the plurality of the dummy metals provided in the electrode pad positioned at another position, along a direction from the center of the semiconductor chip toward the electrode pad positioned at the another position.

As described above, when a dummy metal is positioned along a direction from the center of the semiconductor chip toward the electrode pad including the dummy metal, it is possible to suppress expansion of a crack generated due to bump stress concentrated on the under-edge portion 109 below the barrier metal 107 between the pad-form wiring metal 102 and the wiring metal 103 as described in the first embodiment. In the structure of the diagonal line pattern depending on the direction in which the bump stress is applied to each electrode pad, generation of a crack due to bump stress concentrated on the under-edge portion 109 below the barrier metal 107 may not be easily caused.

As described above, the electrode structure for the semiconductor chip according to the fourth embodiment of the present invention allows suppression of expansion of a crack generated due to bump stress concentrated on the under-edge portion below the barrier metal, and enhancement of reliability of the bump connection of the electrode pad.

Although in the electrode pad according to each of the first to the fourth embodiments the pad-form wiring metal and the wiring metal are provided in the uppermost layer portion of the semiconductor substrate, a potential of the wiring metal may be different from a potential of the pad-form wiring metal.

Although in the electrode pad according to each of the first to the fourth embodiments an area, above the semiconductor substrate, in which the barrier metal is not formed is covered by the resin protective film, the present invention is not limited thereto.

The dummy pattern of the electrode structure for the semiconductor chip according to the present invention is not limited to the dummy pattern of any of the first to the fourth embodiments. Any pattern which enables suppression of crack generation or enables prevention of expansion of the generated crack may be used. Further, the number of the dummy metals forming the pattern may be greater than or equal to one.

Further, although, in the electrode pad according to any of the first to the fourth embodiments, the dummy pattern having no potential is provided in the uppermost layer portion of the semiconductor substrate between the pad-form wiring metal and the wiring metal, the present invention is not limited thereto. The metal pattern having the same potential as the pad-form wiring metal may be used instead of the dummy pattern having no potential. For example, the metal pattern formed by wired metals may also exert the same effect as the dummy pattern according to any of the first to the fourth embodiments.

Fifth Embodiment

Figure 10B:
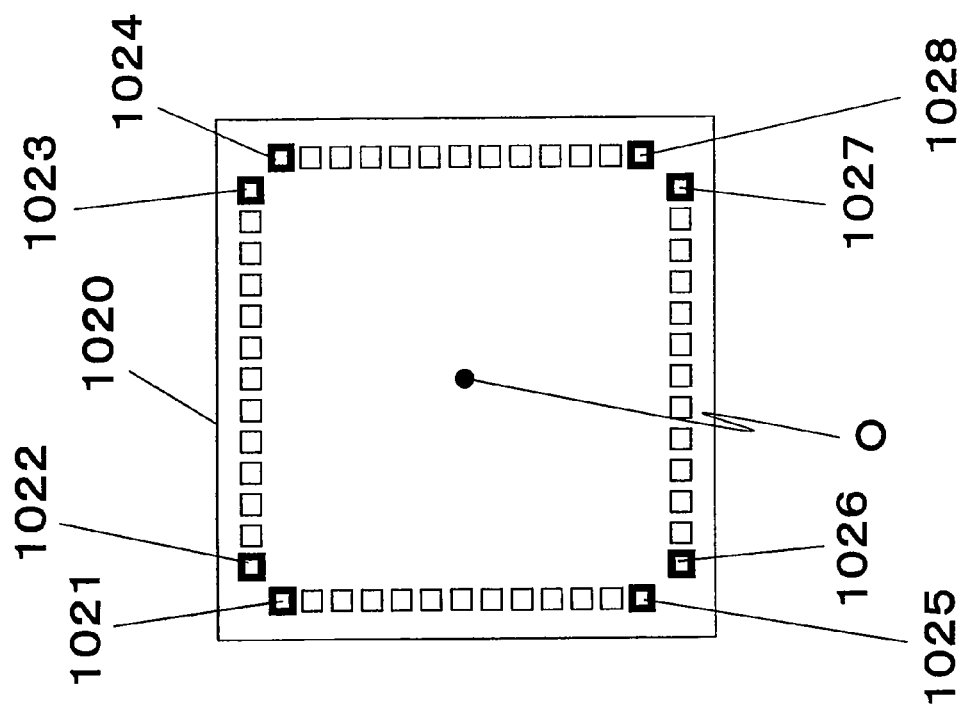
FIG. 10B is a diagram illustrating a peripheral pad for a semiconductor chip according to the fifth embodiment of the present invention.
Figure 10A:
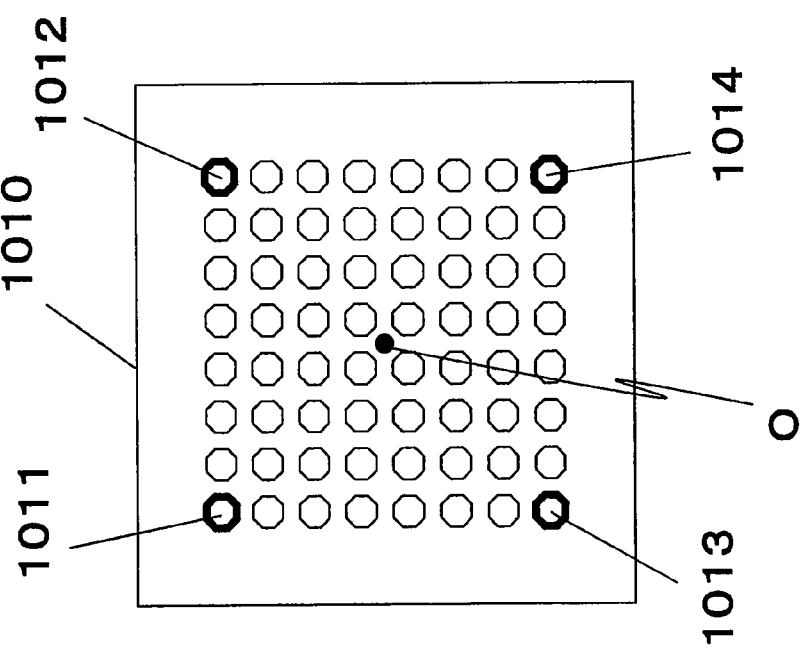
FIG. 10A is a diagram illustrating an area pad for a semiconductor chip according to a fifth embodiment of the present invention.
Figure 11B:
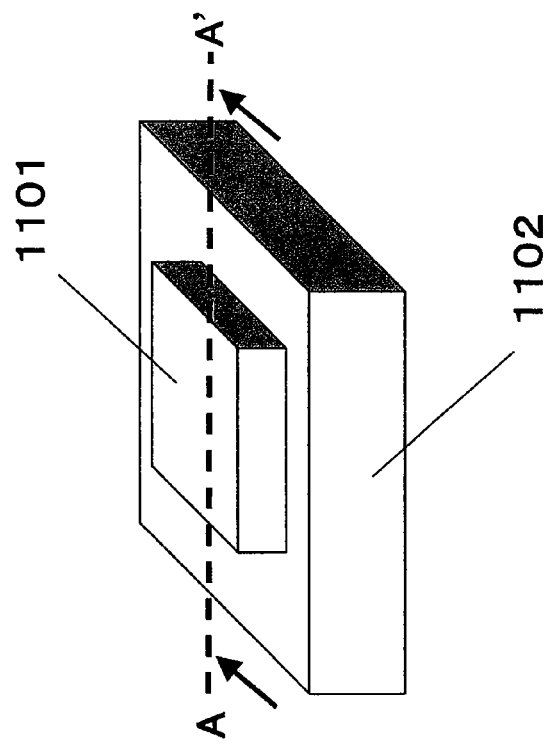
FIG. 11B is a cross-sectional view of the flip-chip connection structure of the conventional semiconductor device.
Figure 11A:
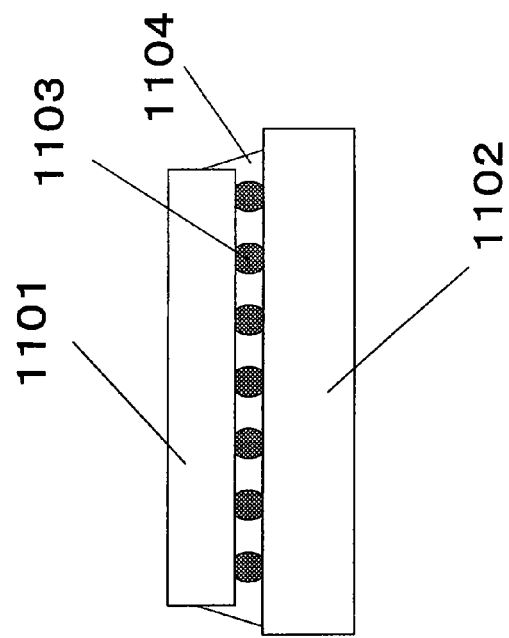
FIG. 11A is a diagram illustrating a flip-chip connection structure of a conventional semiconductor device.
Figure 12B:
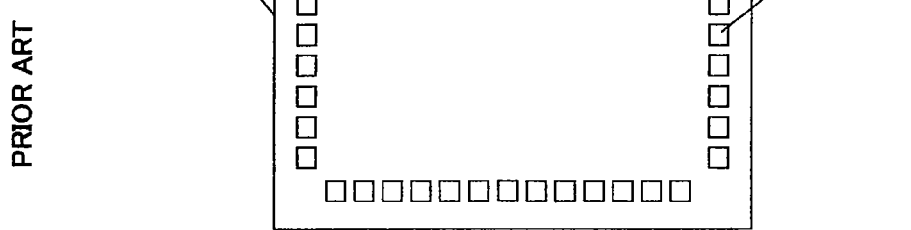
FIG. 12B is a diagram illustrating a peripheral pad for a conventional semiconductor chip.
Figure 12A:
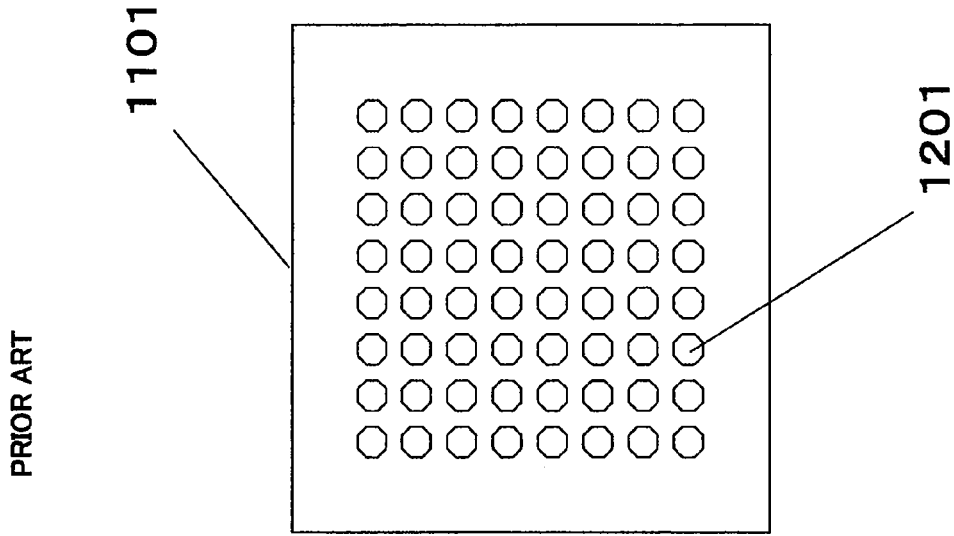
FIG. 12A is a diagram illustrating an area pad for a conventional semiconductor chip.
Figure 13:
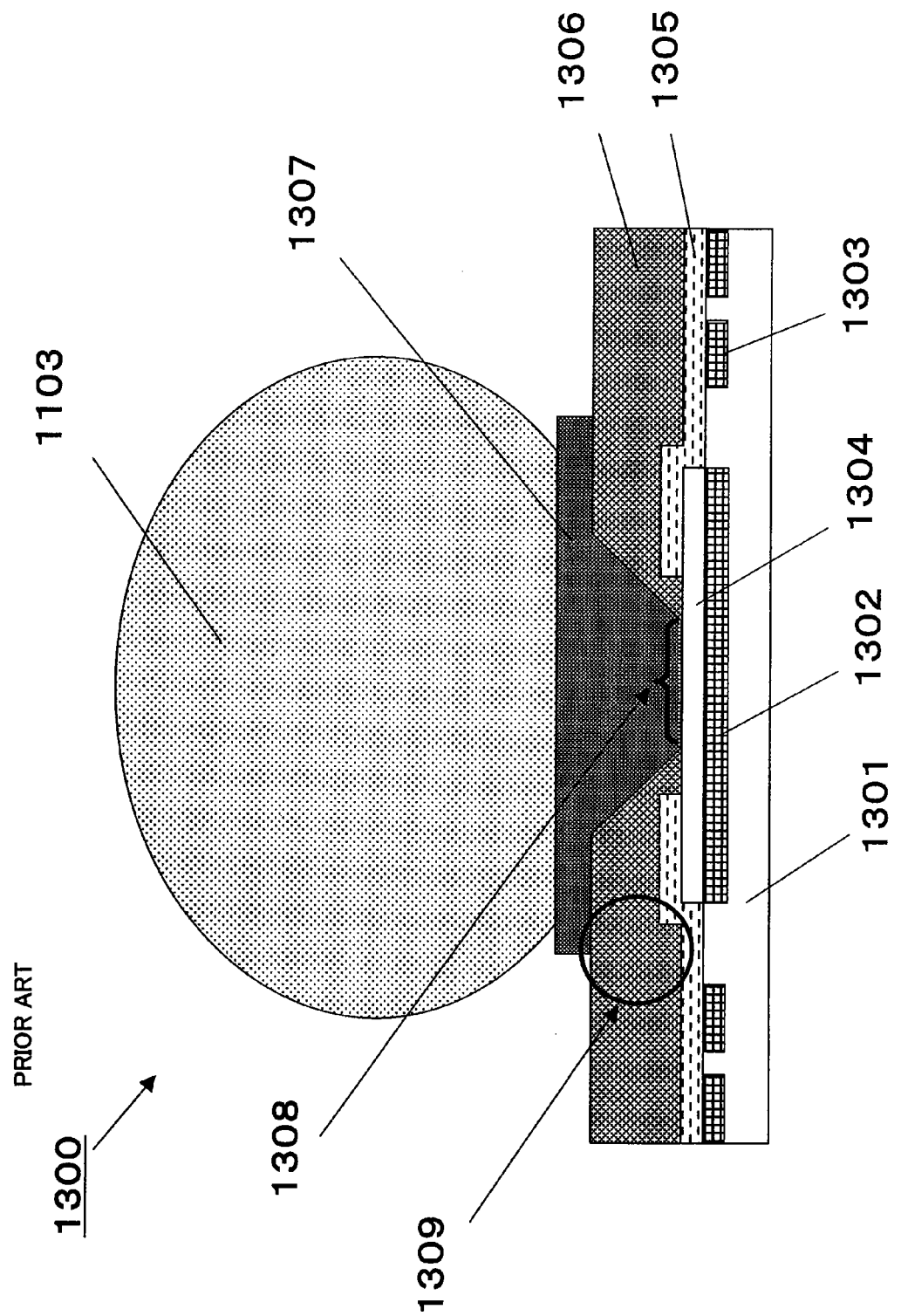
FIG. 13 is a diagram illustrating a bump electrode for a conventional semiconductor device.
Figure 14:
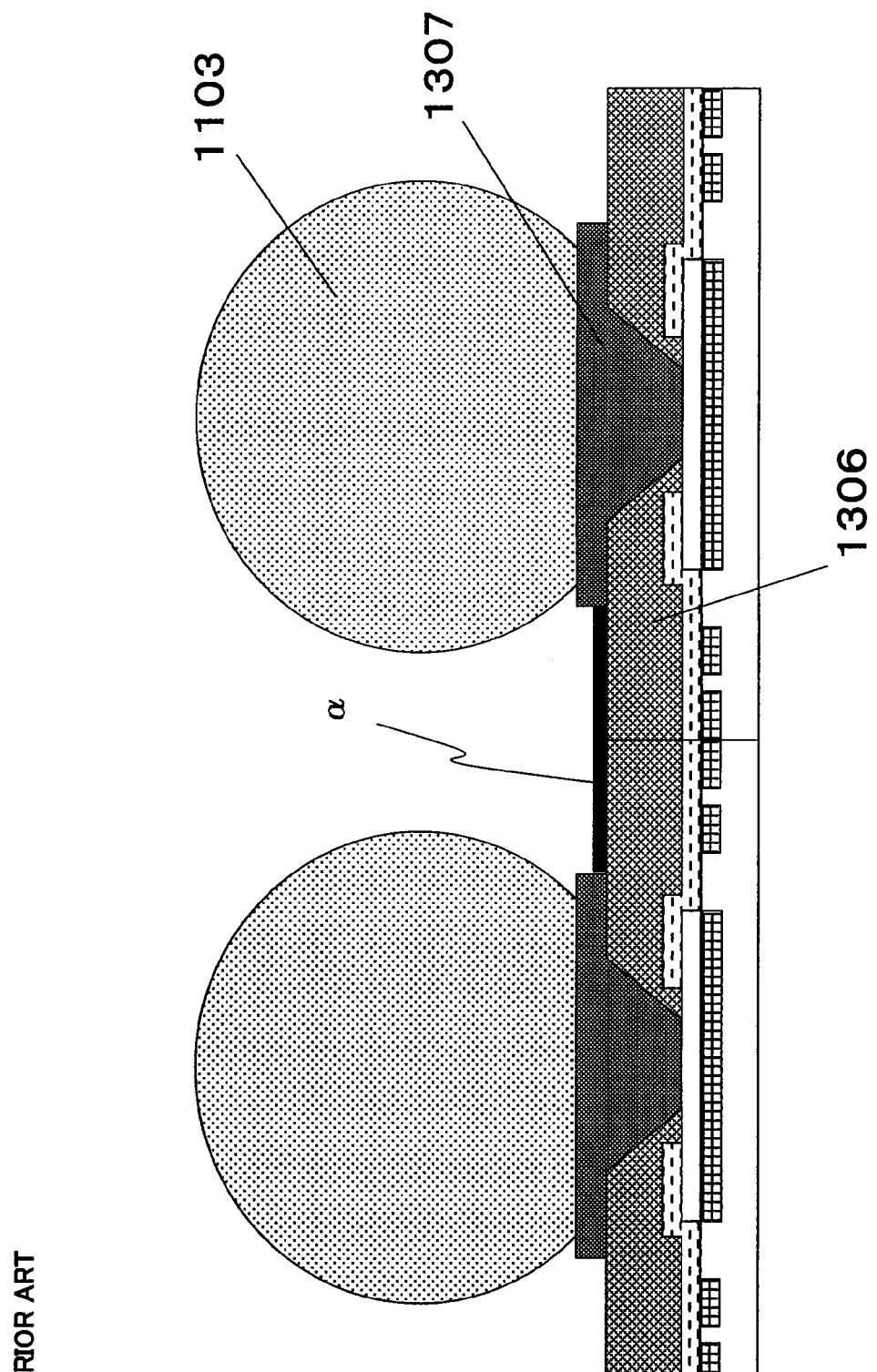
FIG. 14 is a diagram illustrating bump electrodes, adjacent to each other, of the conventional semiconductor device.

Positioning of the electrode pads according to the first to the fourth embodiments in the semiconductor chip will be described in a fifth embodiment of the present invention. FIG. 10A is a diagram illustrating a layout pattern of an area pad in which the electrode pads are positioned over the entire surface of the semiconductor chip 1010. FIG. 10B is a diagram illustrating a layout pattern of a peripheral pad in which the electrode pads are provided in the edge portion of the semiconductor chip 1020.

In the semiconductor chip 1010 shown in FIG. 10A, the electrode pad according to any of the first to the fourth embodiments is used only as the electrode pads 1011 to 1014 provided at positions (four corners of the semiconductor chip) which are farthest from the center O of the semiconductor chip 1010. Also in the semiconductor chip 1020 shown in FIG. 10B, the electrode pad according to any of the first to the fourth embodiments is used only as the electrode pads 1021 to 1028 provided at positions which are farthest from the center O of the semiconductor chip 1020.

In general, in the flip-chip connection structure, the applied bump stress is likely to be maximized at the under-edge portion below the barrier metal of the electrode pad provided at a position farthest from the center of the semiconductor chip. This is because the semiconductor chip is made of silicon, and the interposer substrate is made of resin, and, due to difference in thermal expansion coefficient therebetween, a bump distortion is maximized in the under-edge portion below the barrier metal of the electrode pad provided at a position farthest from the center of the semiconductor chip.

As described above, the electrode pad according to any of the first to the fourth embodiments is used only as the electrode pads provided at positions farthest from the center of the semiconductor chip, and therefore it is possible to suppress expansion of a crack generated due to bump stress concentrated on the under-edge portion 109 below the barrier metal 107 between the pad-form wiring metal 102 and the wiring metal 103, in the electrode pad to which the maximum bump stress is likely to be applied.

As described above, in the electrode structure for the semiconductor chip according to the fifth embodiment of the present invention, it is possible to suppress expansion of a crack generated due to bump stress concentrated on the under-edge portion below the barrier metal in the electrode pads provided at/around the four corners, for the semiconductor chip, which are positioned farthest from the center of the semiconductor chip, thereby enhancing the reliability of bump connection of the electrode pad.

When the electrode pad according to any of the first to the fourth embodiments is used as the electrode pads provided at positions farthest from the center of the semiconductor chip, the electrode pad according to any of the first to the fourth embodiments may be used as the electrode pads provided at positions other than the positions farthest from the center of the semiconductor chip.

While the invention has been described in detail, the foregoing description is in all aspects illustrative and not restrictive. It is understood that numerous other modifications and variations can be devised without departing from the scope of the invention.

What is claimed is:

1. An electrode structure for a semiconductor chip, comprising:
    a semiconductor substrate;
    an interlayer film on the semiconductor substrate, the interlayer film having a pad-form wiring metal and a wiring metal, and the pad-form wiring metal and the wiring metal disposed at the same level;
    a first protective film having an opening, the first protective film is in contact with the interlayer film;
    a barrier metal disposed in the opening of the first resin protective film,
    a bump disposed on the barrier metal, and
    a first dummy pattern and a second dummy pattern disposed between the pad-form wiring metal and the wiring metal, the first dummy pattern disposed outside the second dummy pattern in plan view,
    wherein the first dummy pattern is disposed vertically below a first outer edge of the barrier metal, and
    the first dummy pattern and the second dummy pattern are in contact with the first protective film.

2. The electrode structure for the semiconductor chip according to claim 1, further comprising a second protective film disposed on the first protective film, and
    wherein a region above the region in which the first dummy pattern and the second dummy pattern are disposed includes an air gap region between the second protective film and the barrier metal.

3. The electrode structure for the semiconductor chip according to claim 1,
    wherein the first dummy pattern and the second dummy pattern each include at least one dummy metal, and
    wherein an edge of each dummy metal and the first outer edge of the barrier metal are not aligned in a line extending vertically downward from the first outer edge of the barrier metal.

4. A semiconductor chip having a plurality of electrodes on an upper surface thereof,
    wherein the electrode structure according to claim 1 is formed only at and around four corners of the semiconductor chip, the four corners of the semiconductor chip being farthest from a center of the semiconductor chip.

5. The electrode structure for the semiconductor chip according to claim 1, wherein the first outer edge of said barrier metal extends beyond an outer edge of said pad-form wiring metal in plan view.

6. The electrode structure for the semiconductor chip according to claim 1, wherein the second dummy pattern surrounds the pad-form wiring metal in plan view.

7. The electrode structure for the semiconductor chip according to claim 1, wherein a first distance between the first dummy pattern and the second dummy pattern is shorter than a second distance between the first dummy pattern and the wiring metal.

8. The electrode structure for the semiconductor chip according to claim 1, further comprising a second protective film disposed on the first protective film, and wherein the second protective film is apart from the barrier metal in plan view.

9. The electrode structure for the semiconductor chip according to claim 1, further comprising a second protective film disposed on the first protective film, and
    wherein a top surface of the second protective film is higher than a top surface of the barrier metal.

10. The electrode structure for the semiconductor chip according to claim 1, wherein a bottom surface of the bump is directly connected to a top surface of the barrier metal.

11. The electrode structure for the semiconductor chip according to claim 1,
    wherein the barrier metal has a first top surface and a second top surface,
    the first top surface of the barrier metal is directly connected to a bottom surface of the bump, and
    the second top surface of the barrier metal is not connected to the bottom surface of the bump.

12. The electrode structure for the semiconductor chip according to claim 1,
    wherein the barrier metal has a second outer edge inside the first outer edge of the barrier metal,
    a side surface of the first productive film is connected to the second outer edge of the barrier metal.

13. The electrode structure for the semiconductor chip according to claim 1,
    wherein the barrier metal has a second outer edge inside the first outer edge of the barrier metal,
    the second dummy pattern is disposed vertically below the second outer edge of the barrier metal.

14. The electrode structure for the semiconductor chip according to claim 1, wherein the first dummy pattern is parallel to the second dummy pattern in plan view.

15. The electrode structure for the semiconductor chip according to claim 1, wherein the first dummy pattern and the second dummy pattern are completely disposed outside the opening in plan view.

16. The electrode structure for the semiconductor chip according to claim 1, wherein the first protective film is a single layer.

17. The electrode structure for the semiconductor chip according to claim 1, further comprising a pad connecting metal disposed on the pad-form wiring metal, and
    wherein the opening of the first protective film is provided so as to expose the pad connecting metal, and
    the barrier metal is disposed on the pad connecting metal.

18. The electrode structure for the semiconductor chip according to claim 1, wherein said structure suppresses expansion of a crack generated in a vertically downward direction from the first outer edge of the barrier metal.

19. The electrode structure for the semiconductor chip according to claim 1, wherein the first dummy pattern and the second dummy pattern include a plurality of dummy metals, wherein the first dummy pattern surrounds the second dummy pattern in plan view.

20. The electrode structure for the semiconductor chip according to claim 19, wherein the plurality of dummy metals are equally spaced from each other, and interlayer films are formed between any adjacent dummy metals among the plurality of dummy metals.

21. The electrode structure for the semiconductor chip according to claim 19, wherein the plurality of dummy metals are positioned radially from a center of the semiconductor chip.

22. The electrode structure for the semiconductor chip according to claim 19, wherein the plurality of dummy metals form a continuous surface.

23. The electrode structure for the semiconductor chip according to claim 22, wherein the plurality of dummy metals forming the continuous surface each has a regular hexagonal shape.

24. An electrode structure for a semiconductor chip, comprising:
    a semiconductor substrate;
    an interlayer film on the semiconductor substrate, the interlayer film having a pad-form wiring metal and a wiring metal, and the pad-form wiring metal and the wiring metal disposed at the same level;
    a first protective film having an opening, the first protective film is in contact with the interlayer film;
    a barrier metal disposed in the opening of the first protective film,
    a bump disposed on the barrier metal, and
    a dummy pattern disposed between the pad-form wiring metal and the wiring metal,
    wherein the dummy pattern is disposed vertically below a first outer edge of the barrier metal, and
    the dummy pattern is in contact with the first protective film.

25. The electrode structure for the semiconductor chip according to claim 24, wherein the dummy pattern surrounds the pad-form wiring metal in plan view.

26. The electrode structure for the semiconductor chip according to claim 24, further comprising a second protective film disposed on the first protective film, and
    wherein the second protective film is apart from the barrier metal in plan view.

27. The electrode structure for the semiconductor chip according to claim 24, further comprising a second protective film disposed on the first protective film, and
    wherein a top surface of the second protective film is higher than a top surface of the barrier metal.

28. The electrode structure for the semiconductor chip according to claim 24, wherein a bottom surface of the bump is directly connected to a top surface of the barrier metal.

29. The electrode structure for the semiconductor chip according to claim 24,
    wherein the barrier metal has a first top surface and a second top surface,
    the first top surface of the barrier metal is directly connected to a bottom surface of the bump, and
    the second top surface of the barrier metal is not connected to the bottom surface of the bump.

30. The electrode structure for the semiconductor chip according to claim 24,
    wherein the barrier metal has a second outer edge inside the first outer edge of the barrier metal,
    a side surface of the first productive film is connected to the second outer edge of the barrier metal.

31. The electrode structure for the semiconductor chip according to claim 24,
    wherein the barrier metal has a second outer edge inside the first outer edge of the barrier metal,
    the dummy pattern is disposed vertically below the second outer edge of the barrier metal.

32. The electrode structure for the semiconductor chip according to claim 24, wherein the first protective film is a single layer.

33. The electrode structure for the semiconductor chip according to claim 24, further comprising a pad connecting metal disposed on the pad-form wiring metal, and
    wherein the opening of the first protective film is provided so as to expose the pad connecting metal, and
    the barrier metal is disposed on the pad connecting metal.

* * * * *